United States Patent
Lee et al.

(10) Patent No.: US 9,842,767 B2
(45) Date of Patent: Dec. 12, 2017

(54) METHOD OF FORMING AN INTERCONNECTION

(71) Applicant: Taiwan Semiconductor Manufacturing Company, Ltd., Hsin-Chu (TW)

(72) Inventors: Ming-Han Lee, Taipei (TW); Tz-Jun Kuo, Hsinchu (TW); Chien-Hsin Ho, Taichung (TW); Hsiang-Huan Lee, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

(21) Appl. No.: 14/299,089

(22) Filed: Jun. 9, 2014

(65) Prior Publication Data

US 2015/0017799 A1    Jan. 15, 2015

Related U.S. Application Data

(63) Continuation of application No. 13/624,384, filed on Sep. 21, 2012, now Pat. No. 8,749,060.

(51) Int. Cl.
  *H01L 21/768*  (2006.01)
  *H01L 23/532*  (2006.01)
  *H01L 21/288*  (2006.01)

(52) U.S. Cl.
  CPC .... *H01L 21/76847* (2013.01); *H01L 21/2885* (2013.01); *H01L 21/76846* (2013.01); *H01L 21/76861* (2013.01); *H01L 21/76873* (2013.01); *H01L 21/76879* (2013.01); *H01L 23/53233* (2013.01); *H01L 23/53238* (2013.01); *H01L 23/53295* (2013.01); *H01L 2221/1063* (2013.01); *H01L 2924/0002* (2013.01)

(58) Field of Classification Search
  CPC ......... H01L 21/76843; H01L 23/53238; H01L 21/76846; H01L 23/53223; H01L 21/76877
  See application file for complete search history.

(56) References Cited

U.S. PATENT DOCUMENTS

| | | | | |
|---|---|---|---|---|
| 5,658,828 A | * | 8/1997 | Lin | .............. C23C 16/0281 |
| | | | | 204/192.17 |
| 6,518,183 B1 | * | 2/2003 | Chang | ........... H01L 21/76883 |
| | | | | 257/E21.576 |
| 6,566,250 B1 | * | 5/2003 | Tu | .................. H01L 21/288 |
| | | | | 257/E21.174 |

(Continued)

FOREIGN PATENT DOCUMENTS

JP    2002076000 A  *  3/2002

OTHER PUBLICATIONS

Machine translation for reference JP 2002076000 A.*

Primary Examiner — Marcos D Pizarro
Assistant Examiner — Long H Le
(74) Attorney, Agent, or Firm — Haynes and Boone, LLP

(57) ABSTRACT

A method of fabricating a semiconductor integrated circuit (IC) is disclosed. The method includes providing a substrate. A patterned dielectric layer with a plurality of openings is formed on the substrate. A barrier layer is deposited in the openings by a first tool and a sacrificing protection layer is deposited on the barrier layer by the first tool. The sacrificing layer is removed and a metal layer is deposited on the barrier layer by a second tool.

20 Claims, 6 Drawing Sheets

(56) References Cited

U.S. PATENT DOCUMENTS

| | | | |
|---|---|---|---|
| 6,849,541 B1* | 2/2005 | Hu | H01L 21/76811 257/E21.579 |
| 2005/0230263 A1 | 10/2005 | Dubin | |
| 2006/0151887 A1 | 7/2006 | Oh et al. | |
| 2008/0179747 A1 | 7/2008 | Sakai et al. | |
| 2008/0213998 A1* | 9/2008 | Nagai | C23C 14/14 438/653 |
| 2008/0286965 A1* | 11/2008 | Lee | H01L 21/76846 438/643 |
| 2008/0303155 A1* | 12/2008 | Lu | H01L 21/3121 257/751 |
| 2010/0327446 A1* | 12/2010 | Yang | H01L 21/76805 257/751 |
| 2011/0186186 A1* | 8/2011 | Fukazawa | C21D 1/06 148/525 |
| 2012/0156872 A1* | 6/2012 | Cao | H01L 21/76843 438/643 |
| 2013/0323930 A1* | 12/2013 | Chattopadhyay | H01L 21/02107 438/703 |
| 2014/0084469 A1 | 3/2014 | Lee | |

* cited by examiner

METHOD OF FORMING AN INTERCONNECTION

PRIORITY DATA

This application is a continuation application of U.S. application Ser. No. 13/624,384, filed Sep. 21, 2012, which is hereby incorporated by reference in its entirety.

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, challenges rise to develop a more flexible integration for copper interconnection in term of formations of barrier, copper seed and copper layers. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
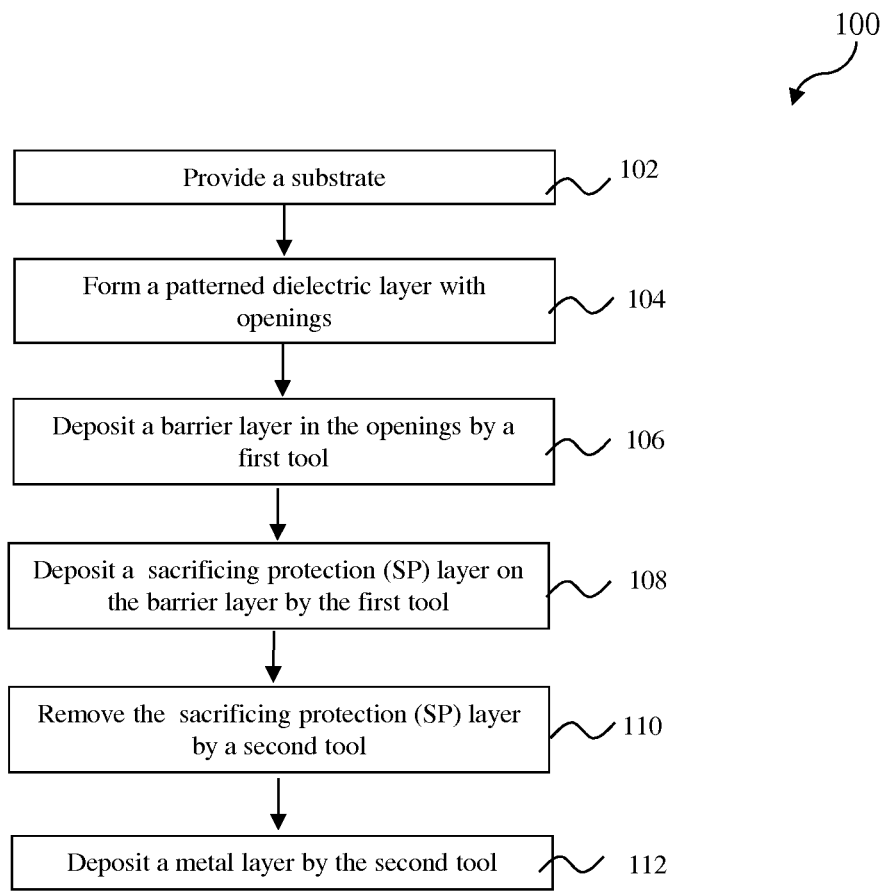
FIG. 1 is a flowchart of an example method for fabricating a semiconductor integrated circuit (IC) constructed according to various aspects of the present disclosure.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 to 6 for the sake of example.

Figure 2:
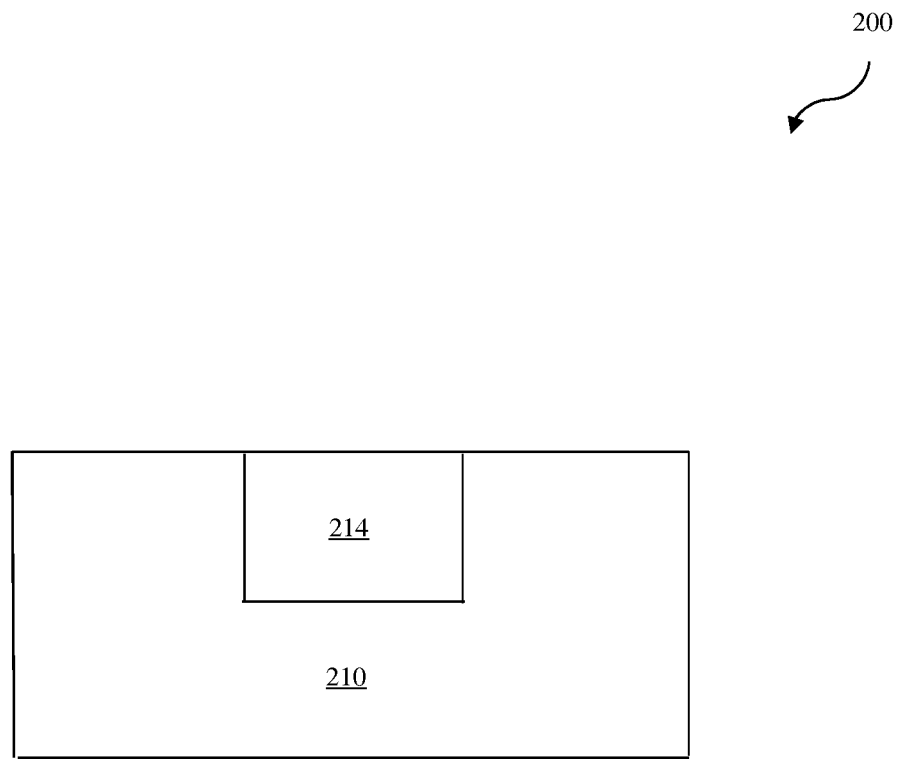
FIGS. 2 to 6 are cross-sectional views of an example semiconductor IC device at fabrication stages constructed according to the method of FIG. 1.

Referring also to FIG. 2, the method 100 begins at step 102 by providing a semiconductor substrate 210. The semiconductor substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The substrate 210 includes conductive features 214. The conductive features 214 include a portion of the interconnect structure. For example, the conductive features 214 include contacts, metal vias, or metal lines. In one embodiment, the conductive features 214 are further surrounded by a barrier layer to prevent diffusion and/or provide material adhesion. The conductive feature 214 may include aluminum (Al), copper (Cu) or tungsten (W). The barrier layer may include titanium nitride (TiN), tantalum nitride (TaN), tungsten nitride (WN), titanium silicon nitride (TiSiN) or tantalum silicon nitride (TaSiN). The conductive features 214 (and the barrier layer) may be formed by a procedure including lithography, etching and deposition. In another embodiment, the conductive features 214 include electrodes, capacitors, resistors or a portion of a resistor. Alternatively, the conductive features 214 may include doped regions (such as sources or drains), or gate electrodes. In another example, the conductive features 214 are silicide features disposed on respective sources, drains or gate electrodes. The silicide feature may be formed by a self-aligned silicide (salicide) technique.

Figure 3:
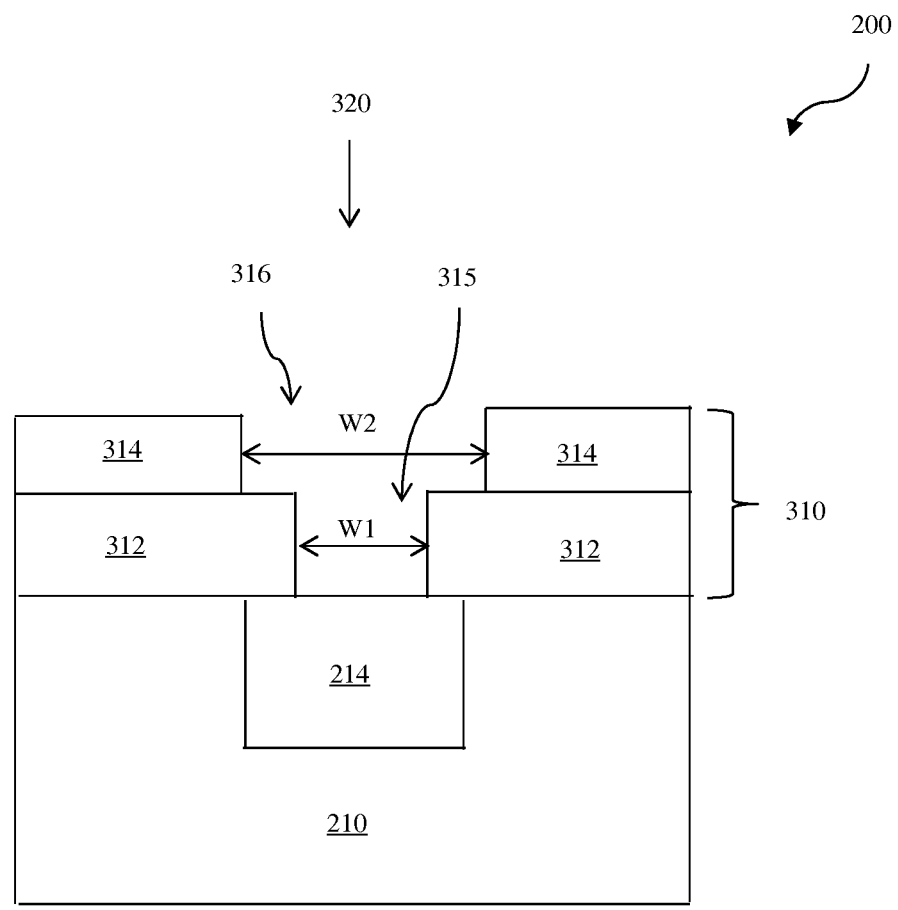

Referring to FIGS. 1 and 3, the method 100 proceeds to step 104 by forming a patterned dielectric layer 310 on the substrate 210. In the present embodiment, the dielectric layer 310 includes an inter-metal dielectric (IMD) layer. The dielectric layer 310 is disposed on the substrate 210 and the conductive features 214. The dielectric layer 310 includes a dielectric material layer, such as silicon oxide, silicon nitride, a dielectric material layer having a dielectric constant (k) lower than thermal silicon oxide (therefore referred to as low-k dielectric material layer), or other suitable dielectric material layer. A process of forming the dielectric layer 310 may utilize spin-on coating or chemical vapor deposition (CVD). The dielectric layer 310 may be patterned by lithography and etching processes to form openings 320 in the dielectric layer 310 such that the respective conductive features 214 are at least partially exposed within the openings 320.

In one embodiment, the dielectric layer 310 includes a patterned first dielectric layer 312 formed on the substrate 210 and a patterned second dielectric layer 314 formed on top of the patterned first dielectric layer 312. The first dielectric layer 312 is deposited on the substrate 210 and patterned to form first openings 315, referred to as vias 315, by lithography and etching processes. The second dielectric layer 314 is deposited on top of the patterned first dielectric layer 312 and patterned to form second openings 316, referred to as trenches 316, on the top of the vias 315. Each center of the trenches 316 is aligned to a respective center of vias 315. The vias 315 has a vertical sidewall profile with a first width w1 and the trenches 316 have a vertical sidewall profile with a second width w2. In the present embodiment, w2 is larger than w1. In this case, the openings 320 is a combining opening of the vias 315 and the trenches 316 such that it has the vias 315 as its lower portion and the trench 316 as its upper portion. A formation of the patterned second dielectric layer 314 is similar in many respects to the one of the patterned first dielectric layer 312. It is understood that the openings 320 do not have to be multi-tiered, as shown with openings 315 and 316.

Figure 4:
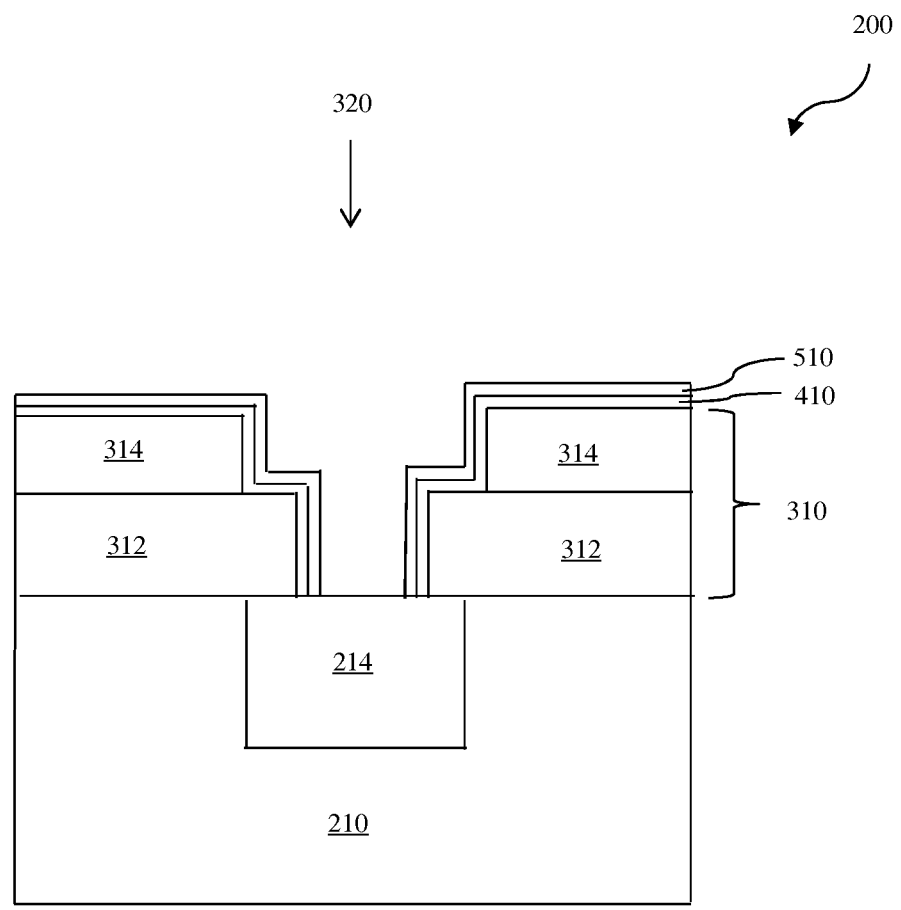

Referring to FIGS. 1 and 4, the method 100 proceeds to step 106 by depositing a barrier layer 410 in the openings 320 by a first tool. In one embodiment, the barrier layer 410 includes metal and is electrically conductive but does not permit inter-diffusion and reactions between the dielectric layer 310 and a metal layer to be filled in the openings 320 later. The barrier layer 410 may include refractory metals and their nitrides. In various examples, the barrier layer 410 includes of tantalum (Ta), tantalum nitride (TaN), titanium nitride (TiN), cobalt (Co), tungsten nitride (WN), titanium silicon nitride (TiSiN), and tantalum silicon nitride (TaSiN), or combinations thereof. The barrier layer 410 may include multiple films. The first tool includes a physical vapor deposition (PVD) tool, a chemical vapor deposition (CVD) too, a metal-organic chemical vapor deposition (MOCVD) tool and an atomic layer deposition (ALD) tool, or other suitable tools.

The method 100 proceeds to step 108 by depositing a sacrificing protection (SP) layer 510 on the barrier layer 410 by the first tool without exposing the barrier layer 410 to an oxidation ambient. The SP layer 510 is formed conformably on of the barrier layer 410. A material of the SP layer 510 is chosen such that it is able to be removed by a subsequent metal deposition tool, which will be described in details later. In one embodiment, the SP layer 510 includes manganese (Mn), manganese oxide ($MnO_x$), cobalt (Co), cobalt oxide ($CoO_x$), aluminium (Al), aluminium oxide ($AlO_x$), where x represents oxide composition in atomic percent.

The method 100 proceeds to step 110 by removing the SP layer 510 to expose the barrier layer 410 by a second tool. The SP layer 510 is removed in the second tool without exposing the barrier layer 410 to an oxidation ambient. In one embodiment, the second tool is a different tool than the first tool. As an example, the second tool is an electrochemical plating (ECP) tool. In the ECP tool, the substrate 210 having the SP layer 510 thereon is submerged in an ECP electrolyte solution. Thereby the SP layer 510 is dissolved into the ECP electrolyte solution and the barrier layer 410 is exposed.

Figure 5:
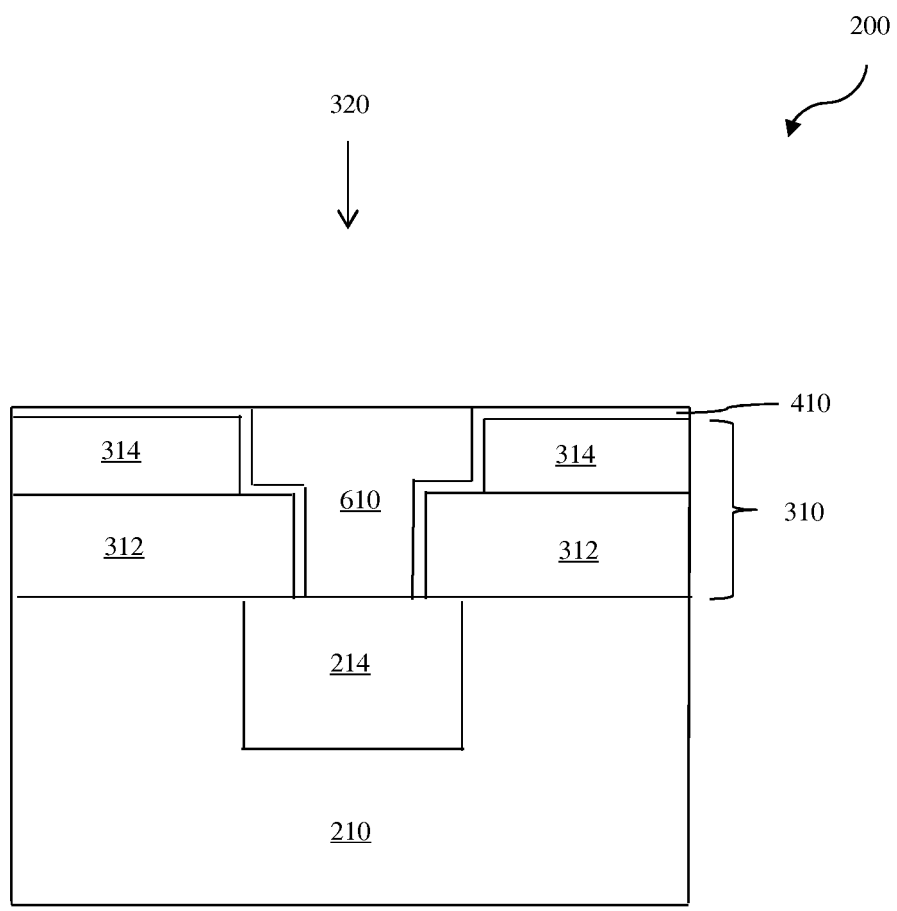

Referring to FIGS. 1 and 5, the method 100 proceeds to step 112 by depositing a metal layer 610 on the exposed barrier layer 410 by the second tool, without exposing the exposed barrier layer 410 to an oxidation ambient. The metal layer 610 at least partially fills in the openings 320. The metal layer 610 may include copper or copper alloy, such as copper manganese (CuMn), copper aluminum (CuAl), copper titanium, (CuTi), copper vanadium (CuV), copper chromium (CuCr), copper silicon (CuSi) or copper niobium (CuNb).

In one embodiment, the metal layer 610 is a copper layer. In the ECP tool, after the SP layer 510 is dissolved and the barrier layer 410 is exposed, the copper layer 610 is electroplated in the ECP electrolyte solution with a surface of the barrier layer 410 as the negative electrode of the electrochemical cell. The copper layer 610 is filled bottom-up the openings 320 and also deposited on a surface of the barrier layer 410 layer.

Figure 6:
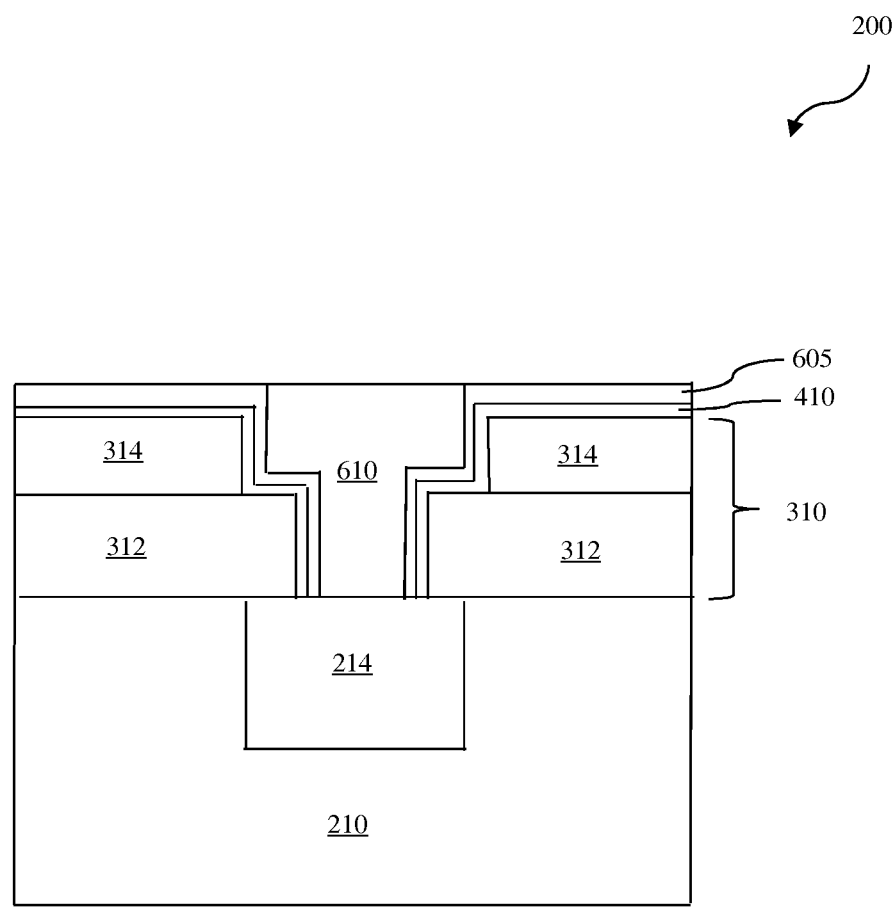

Referring also FIG. 6, in another embodiment, by using the ECP tool, a copper seed layer 605 is deposited on the exposed barrier layer 410 first by a copper-seed ECP process and followed by a bulk-copper ECP process to fill bottom-up the openings 320. Additionally, in the ECP tool, an electropolishing process may be applied to remove most of the copper layer 610 above the openings 320 by using the ECP electrolyte with the surface of the barrier layer 410 as the positive electrode of an electrochemical cell.

Additional steps can be provided before, during, and after the method 100, and some of the steps described can be replaced, eliminated, or moved around for additional embodiments of the method 100.

Based on the above, the present disclosure offers methods for fabricating IC device. The method employs a sacrificing protection layer in interconnection integration scheme. Having the SP layer as a temporary protection layer, the barrier and metal layer can be formed in two different tools without introducing a reduction process to deoxygenize an oxidized barrier layer prior to metal layer deposition. It provides a fairly independent and flexible integration scheme for choosing barrier material and barrier deposition process type. It may extend lifetime of existing barrier processes.

The present disclosure provides many different embodiments of fabricating a semiconductor IC that provide one or more improvements over other existing approaches. In one embodiment, a method for fabricating a semiconductor integrated circuit (IC) includes providing a substrate and forming a patterned dielectric layer on the substrate. The patterned dielectric layer has a plurality of openings to expose at least a portion of the substrate. The method also includes depositing a barrier layer in the openings by a first tool, then depositing a sacrificing protection (SP) layer on the barrier layer in the openings by the same tool. The method also includes removing the SP layer to expose the barrier layer by a second tool and without exposing the barrier layer to an oxidation ambient, depositing a metal layer on the exposed barrier layer by the second tool.

In another embodiment, a method for fabricating a semiconductor IC includes providing a substrate and forming a patterned a dielectric layer with a plurality of openings on the substrate. The method also includes depositing a barrier layer in the openings by a first tool and depositing conformably a sacrificing protection (SP) layer on the barrier layer by the first tool. The method also includes dissolving the SP layer to expose the barrier layer in a second tool, an electrochemical plating (ECP) tool and without exposing the barrier layer to oxidation ambient, depositing a copper layer on the exposed barrier layer in the ECP tool to at least partially fill in the openings.

In yet another embodiment, a semiconductor IC fabricated by the method of the present disclosure includes a substrate and a patterned dielectric layer on the substrate. The patterned dielectric layer has a plurality of openings to expose at least a portion of the substrate. The semiconductor IC also includes a copper layer, wrapping by a barrier layer, at least partially filled in the openings. The copper layer contains one or more additives from the group consisting of manganese (Mn), cobalt (Co) and aluminum (Al).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a patterned dielectric layer having an opening on a substrate, wherein a first layer is exposed by the opening;
    depositing a barrier layer in the opening, wherein after depositing the barrier layer in the opening a portion of the first layer is exposed within the opening;
    depositing a material layer on the barrier layer in the opening, wherein the material layer includes a metal component;
    removing the material layer, including the metal component, to expose the entire barrier layer within the opening;
    after removing the material layer to expose the entire barrier layer within the opening, depositing a seed layer on the exposed barrier layer, wherein after depositing the seed layer on the exposed barrier layer, the portion of the first layer is exposed within the opening; and
    after depositing the seed layer on the exposed barrier layer, depositing a metal layer on the seed layer without exposing the barrier layer to an oxidation ambient.

2. The method of claim 1, wherein the material layer is deposited on the barrier layer without exposing the barrier layer to an oxidation ambient.

3. The method of claim 1, further comprising forming a doped region in the substrate, and
    wherein the seed layer is deposited directly over the doped region.

4. The method of claim 1, further comprising forming a conductive feature in the substrate, and
    wherein the metal layer physically contacts the conductive feature.

5. The method of claim 4, wherein the conductive feature includes a metal material.

6. The method of claim 1, wherein forming the patterned dielectric layer having the opening on the substrate includes depositing a first dielectric material layer and a second dielectric material layer and patterning the first and second dielectric material layers.

7. The method of claim 1, wherein the metal component includes a metal oxide.

8. A method comprising:
    forming a first dielectric layer having a first opening over a substrate, wherein a first layer is exposed by the first opening;
    forming a second dielectric layer having a second opening over the first dielectric layer;
    depositing a barrier layer in the first and second openings, wherein after depositing the barrier layer in the first and second openings a portion of the first layer is exposed within the first opening;
    depositing a material layer on the barrier layer in the first and second openings, wherein the material layer includes a metal component;
    removing the material layer, including the metal component, to expose the entire barrier layer within the first and second openings;

after removing the material layer to expose the entire barrier layer within the first and second openings, depositing a seed layer on the exposed barrier layer, wherein after depositing the seed layer on the exposed barrier layer, the portion of the first layer is exposed within the first opening; and after depositing the seed layer on the exposed barrier layer, depositing a metal layer on the seed layer without exposing the barrier layer to an oxidation ambient.

9. The method of claim 8, wherein the second opening directly over the first opening such that the second opening is in communication with the first opening.

10. The method of claim 9, wherein the first opening has a first width and the second opening has a second width that is different than the first width.

11. The method of claim 8, wherein the barrier layer includes one or more metals from the group consisting of tantalum (Ta), tantalum nitride (TaN), titanium nitride (TiN), cobalt (Co), tungsten nitride (WN), titanium silicon nitride (TiSiN), and tantalum silicon nitride (TaSiN).

12. The method of claim 8, wherein the metal component includes one or more metals selected from the group consisting of manganese (Mn), cobalt (Co) and aluminum (Al).

13. The method of claim 8, wherein the metal component includes metal compounds selected from the group consisting of manganese oxide (MnOx), cobalt oxide (CoOx) and aluminum oxide (AlOx), where x represents oxide composition in atomic percent.

14. The method of claim 8, wherein depositing the barrier layer in the first and second openings includes depositing the barrier layer by a first tool; and wherein removing the material layer to expose the barrier layer includes removing the material layer by a second tool that is different than the first tool.

15. The method of claim 8, wherein the material layer is deposited on the barrier layer without exposing the barrier layer to an oxidation ambient.

16. A method comprising:

forming a patterned dielectric layer with an opening on a substrate, wherein a first layer is exposed by the opening;

depositing a barrier layer in the opening, wherein after depositing the barrier layer in the opening a portion of the first layer is exposed within the opening;

depositing a metal material layer on the barrier layer in the opening, wherein the metal material layer includes a metal component;

removing the metal material layer, including the metal component, to expose the entire barrier layer within the opening;

after removing the metal material layer to expose the entire barrier layer, depositing a metal seed layer on the exposed barrier layer, wherein after depositing the seed layer on the exposed barrier layer, the portion of the first layer is exposed within the opening; and after depositing the metal seed layer on the exposed barrier layer, depositing a metal layer on the metal seed layer within the opening and without exposing the barrier layer to an oxidation ambient.

17. The method of claim 16, further comprising forming a conductive feature in the substrate, and wherein the metal layer physically contacts the conductive feature.

18. The method of claim 17, wherein the conductive feature is a silicide feature.

19. The method of claim 17, wherein the conductive feature is another metal feature.

20. The method of claim 16, wherein the metal component includes a metal oxide.

* * * * *